United States Patent [19]

Althouse

[11] Patent Number: 5,682,731

[45] Date of Patent: Nov. 4, 1997

[54] TAPE CARRIER FOR ELECTRONIC AND ELECTRICAL PARTS

[75] Inventor: Victor E. Althouse, Los Altos, Calif.

[73] Assignee: Vichem Corporation, Sunnyvale, Calif.

[21] Appl. No.: 616,675

[22] Filed: Mar. 15, 1996

[51] Int. Cl.⁶ .............................. B65B 9/02; B65B 33/00; B65D 73/02
[52] U.S. Cl. .................. 53/471; 53/485; 53/492; 53/553; 206/713
[58] Field of Search ................. 53/471, 488, 485, 53/553, 591, 461, 492, 381.4, 381.1; 206/713, 717, 718, 710, 719, 813

[56] References Cited

U.S. PATENT DOCUMENTS

| | | |
|---|---|---|
| 3,655,496 | 4/1972 | Ettre et al. ................ 206/713 X |
| 4,575,995 | 3/1986 | Tabuchi et al. ............. 53/591 |
| 4,753,061 | 6/1988 | Braden et al. .............. 53/471 |
| 5,325,654 | 7/1994 | Juntunen et al. ........... 53/471 X |
| 5,390,472 | 2/1995 | Weiler et al. .............. 53/492 X |
| 5,448,874 | 9/1995 | Lemonnier ................ 53/492 X |
| 5,524,765 | 6/1996 | Gutentag ................... 206/713 |

OTHER PUBLICATIONS

Trade Brochure entitled "Shin–Etsu Electro–Pack Carrier Tape" published by Shin–Etsu Polymer Co. Ltd. (Date Unknown).

*Primary Examiner*—James F. Coan

[57] ABSTRACT

A carrier tape for electronic or electrical devices which contains a pocketless support film, a fastening layer on the support film, and a deformable cover film separably attached to the fastening layer. The devices are sandwiched between the fastening layer and the cover film, which deforms to provide an enclosure for the devices.

20 Claims, 1 Drawing Sheet

TAPE CARRIER FOR ELECTRONIC AND ELECTRICAL PARTS

BACKGROUND OF THE INVENTION

1. Field of the Invention

This invention relates to tape carriers for electronic and electrical devices, including semiconductor chips.

2. Introduction to the Invention

When electronic and electrical devices are to be supplied to a desired location, it is conventional to make use of a tape carrier comprising spaced-apart pockets, with one device in each pocket. Such pocketed tapes are sometimes referred to as "embossed" tapes. The tape carrier often has sprocket holes on one or both edge portions so that it can be handled in a controlled manner. The pockets can be formed in the tape, or the tape can have apertures in it, with the bottom of the pocket being formed by a backing member, e.g. a pressure-sensitive adhesive tape. A cover tape, and/or a mechanical retaining member in the pocket, and/or a pressure-sensitive adhesive at the bottom of the pocket, are used to retain the electronic device in the pocket until it is removed, e.g. by means of a vacuum tool. In some cases, the pocket has a hole in the bottom so that an ejector pin can be pushed through the hole to eject the device. These known carrier tapes have one or more of a number of disadvantages. For example, different carriers are usually needed for different devices, since the pockets and the mechanical retaining members must be customized to particular devices, to ensure that the device does not fall out of the pocket and remains in a desired orientation in the pocket. Use of pressure-sensitive adhesives suffers from the disadvantage that some of the adhesive may stick to the device, after it has been removed from the carrier; another disadvantage is that the level of adhesion can change with time and/or ambient conditions. Use of an ejector pin adds complication and can damage the device.

SUMMARY OF THE INVENTION

I have discovered, in accordance with the present invention, that a very satisfactory carrier tape for electronic and electrical devices comprises a carrier member which comprises a pocketless support film and a fastening layer on the support film, and a deformable cover film which is separably attached to the fastening layer. At an assembly station, the devices are placed at desired locations on the carrier member, and the cover film is then brought into contact with the fastening layer, before the tape carrier is removed from the assembly station, to provide a physically stable and environmentally protected package for the devices. When the time comes to remove the devices from the package, the cover film is stripped off the fastening layer, sequentially exposing the devices, and the devices are then removed from the carrier member, e.g. by a vacuum tool. The tape components can be reused, if desired.

In a first preferred aspect, this invention provides an assembly of electronic or electrical devices which comprises (1) a flexible support film which (a) is composed of a polymeric material and (b) comprises (i) two longitudinally extending edge portions, and (ii) a substantially flat, longitudinally extending central portion between the edge portions;

(2) supported by the support film, a fastening layer which is composed of a polymeric material;

(3) a deformable cover film which (a) is composed of polymeric material, and (b) is separably attached to the fastening layer; and (4) a plurality of electronic or electrical devices which are positioned at spaced-apart locations between the cover film and the central portion of the support film, the cover film being deformed around the devices.

In a second preferred aspect, this invention provides a method of making an assembly according to the first preferred aspect, the method comprising (A) providing a support member which comprises
  (1) a flexible support film which (a) is composed of a polymeric material, and (b) comprises (i) two longitudinally extending edge portions, and (ii) a substantially flat, longitudinally extending central portion between the edge portions, and
  (2) supported by the support film, a fastening layer which is composed of a polymeric material;

(B) placing a plurality of electronic or electrical devices on the support member at spaced-apart locations which overlie the central portion of the support film, while the support member is in a generally horizontal position; and (C) applying a deformable cover film to the support member having the devices thereon to form a physically stable and environmentally protected enclosure around the devices.

In a third preferred aspect, this invention provides a method of processing electronic or electrical devices which comprises (A) providing an assembly according to the first preferred aspect of the invention;

(B) advancing said assembly through a work station which separates the cover film from the fastening layer, thus sequentially exposing the electronic devices; and (C) sequentially removing the exposed devices from the support film.

In a fourth preferred aspect, this invention provides a support member which is suitable for use in an assembly according to the first preferred aspect of the invention and which comprises (1) a flexible support film which (a) is composed of a polymeric material, (b) is 0.25 to 2.00 inch wide and (c) comprises (i) two longitudinally extending edge portions, at least one of the edge portions having sprocket holes at longitudinally spaced regular intervals, and (ii) a substantially flat longitudinally extending central portion between the edge portions; and (2) supported on the central portion of the support film, a fastening layer, the fastening layer preferably being composed of an elastomer having a hardness between 20 on the Shore 00 scale and 70 on the Shore A scale.

The invention provides a number of significant advantages, including:

(1) A single tape assembly can be used for a wide variety of different devices, which differ in area and/or thickness, since the devices can be placed in any position on the fastening layer.

(2) Small separations can be used between devices, and the assemblies need be only a little thicker than the devices themselves. This reduces the costs of the carrier per device, and makes the assembly more compact, reducing costs, e.g. of storage, and equipment size.

(3) It is easy to incorporate additional layers, or to modify the support and/or cover films to provide desired properties, e.g. for electrostatic protection or for identification.

(4) Ejector pins are not required.

BRIEF DESCRIPTION OF THE DRAWING

The invention is illustrated in the accompanying drawing, in which.

DETAILED DESCRIPTION OF THE INVENTION

The Support Film

Figure 1:
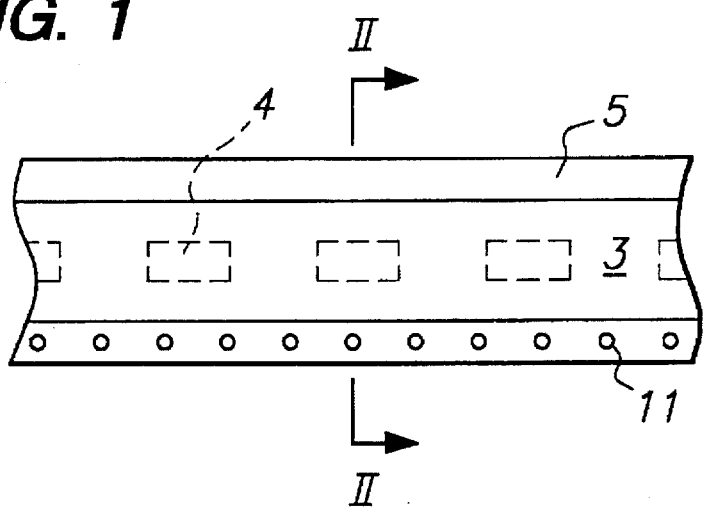
FIG. 1 is a diagrammatic plan view of an assembly of the invention.

A wide variety of polymeric films can be used as the support film. Metallized films are particularly useful since they add to the assembly a layer of metal which provides electrostatic discharge (ESD) protection. The metal layer can lie between the support film and the elastomer layer, or on the opposite surface of the support film. The support film can contain a conductive filler, e.g. carbon black, so that the film is electrically conductive, as well as other conventional polymer additives. Suitable polymers include polyesters, polyamides, polyimides, polyolefins, polyketones, polycarbonates, polyetherimides, fluoropolymers, polystyrene, and polyvinyl chloride.

The thickness of the support film is generally 0.001 to 0.020 inch, preferably 0.001 to 0.015 inch. The cover film will generally have sprocket holes along one or both edge portions thereof. However, the invention includes the possibility that the assembly is handled without the need for sprocket holes. The carrier tape is generally 0.25 to 2.0 inch wide.

The Fastening Layer

The fastening layer is composed of a polymeric material to which the cover film will spontaneously, but separably, adhere when it is applied thereto. The extent of the fastening layer must be such that the cover film, when secured thereto, provides an adequate degree of physical and environmental protection for the devices. In one embodiment, the fastening layer is in the form of a continuous strip which overlies the whole of the central portion of the support film, so that each device contacts the fastening layer. Preferably, the cover film forms a separate enclosure around each device. In another embodiment, the fastening layer is in the form of two longitudinal strips, and optionally and preferably a plurality of transverse bars. When contact between the devices and the fastening layer is undesirable, this arrangement is particularly suitable, since the devices can be placed on the support film without contacting the fastening layer. The distance between the edges of the fastening layer is generally 40 to 90%, preferably 50 to 80%, of the width of the support film. The fastening layer can be formed directly on the support film, or it can be formed on a sub-film which is then secured to the support film. The sub-film can be the same width as, or wider than, the fastening layer.

In preferred embodiments of the invention, the fastening layer is composed of a soft elastomer. However, it is also possible to use a pressure-sensitive adhesive (PSA). The PSA can have a lower tack than is needed in known carrier tapes, because its primary function is to stick to the cover film rather than to the device.

The elastomers preferably used in this invention are sufficiently soft to retain the devices in position while the cover film is applied and after the cover film has been removed. The elastomer layer must also bond to the support film or the sub-film and to the cover film. The elastomer preferably has a hardness which is from 20 on the Shore 00 scale to 70 on the Shore A scale, particularly 50 on the Shore 00 scale to 60 on the Shore A scale, especially 15 to 50, e.g. 20 to 50, on the Shore A scale. Suitable elastomers include polysiloxanes, polyurethanes, various thermoplastic elastomers (urethanes, styrenes, olefinics, copolyesters, alloys and polyamides) and other melt-processible or solvent-processible rubbers. The thickness of the elastomer layer is generally 0.0005 to 0.025 inch, preferably 0.001 to 0.015 inch, particularly 0.001 to 0.006 inch. When the elastomer has a hardness of 15 to 50, e.g. 20 to 50, on the Shore A scale, the layer preferably has a thickness of 0.001 to 0.008 inch, particularly 0.002 to 0.006 inch.

The Cover Film

A wide variety of polymeric films can be used as the cover film. Suitable polymers include polyethylene and the other polymers specified above for the support film, and in addition polyvinyl acetate and cellulosic polymers. The thickness of the support film is generally 0.0005 to 0.020 inch, preferably 0.001 to 0.003 inch. The cover film generally covers at least those portions of the fastening layer which are adjacent to the devices, and preferably covers the whole of the fastening layer. The cover film must adhere to the fastening layer on contact therewith, in order to form a stable enclosure for the devices. The smoother the surface of the cover film which contacts the fastening layer, and the greater the tack of the fastening layer, the better they will adhere to each other. The tack of the fastening layer is linked to its hardness (the lower the hardness, the higher the tack) and can also be modified by the addition of tackifiers and other additives. The cover film may be textured in the areas which contact the devices, to reduce the danger that the devices will adhere to it.

The Devices

The invention is particularly useful for handling small electronic devices, particularly flat devices such as semiconductor chips, both bare and packaged; other suitable devices include flip chips (area array solder bumped devices), and chip scale packages (CSP's). However, it can also be used for handling other small products such as electrical devices. The thickness of the devices is preferably less than 0.025 inch, particularly less than 0.05 inch, e.g. 0.003 to 0.02 inch. The area of the devices is preferably less than 2 inch$^2$, particularly less than 0.75 inch$^2$, e.g. 0.002 to 0.5 inch$^2$.

Release Films

The support members used in this invention, e.g. those according the fourth preferred aspect of the invention, preferably comprise a release film which covers the fastening layer and which is stripped off the support member just before the devices are placed thereon (and may then be discarded). The release film can be composed of any suitable polymeric material, and may be for example as described above for the cover film.

The Drawings

Figure 2:
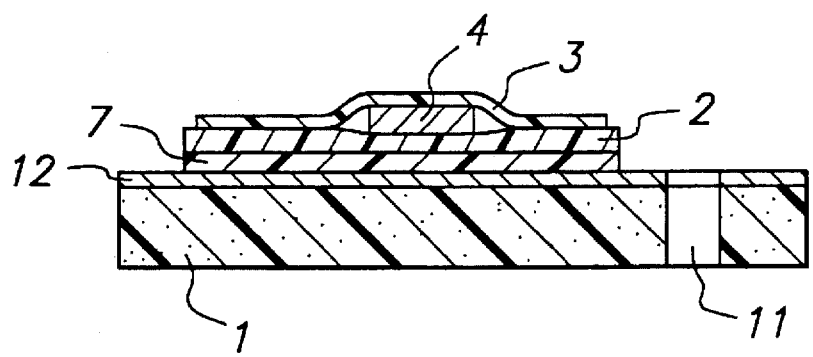
FIG. 2 is a diagrammatic cross-section on line II—II through the assembly of FIG. 1, the thicknesses of the components being exaggerated for clarity.

Referring now to FIGS. 1 and 2 of the drawings, these show a tape assembly of the invention which comprises a support film 1, e.g. composed of polyethylene terephthalate, and optionally having carbon black dispersed therein, find preferably having a layer 12 of aluminum vacuum-deposited thereon, with sprocket holes 11 formed in one edge portion thereof. Along a central part of the support film 1, there is a sub-film 7 and a fastening layer 2 of a polysiloxane elastomer. At spaced-apart locations on the layer 2, there are semi-conductor devices 4, which lie on the surface of, and form very shallow depressions in, the elastomer layer 2. A cover film 5 of polyethylene covers the elastomer layer 2 and the devices 4, and deforms around the devices to form, with the layer 2, a sealed enclosure around each device.

Figure 3:
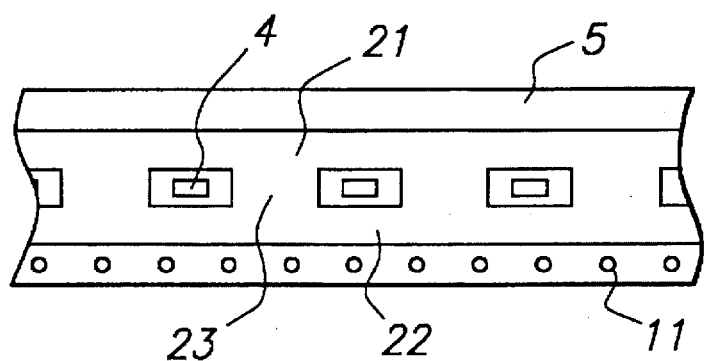
FIG. 3 is a diagrammatic plan view of another assembly of the invention after removal of the cover film.

FIG. 3 is similar to FIG. 1, except that there is no sub-layer 7, the cover film 5 has been removed, and the fastening layer 2 comprises edge portions 22 and transverse portions 23, defining exposed areas of the support film which directly contact the devices 4.

EXAMPLE

A polyester film, 0.005 inch thick, was vacuum metallized on one side with a transparent aluminum deposit, and then coated with a layer 0.005 inch thick of a room-temperature-vulcanizable polysiloxane (Sylgard 184 manufactured by Dow Corning Corporation), which was cured at 65° C. overnight.

Several semiconductor devices of different sizes and having flat surfaces were placed on the surface of the elastomer coating at various locations, and were held in place on contact. Other devices having irregular surfaces, including an area array solder bumped device (flip chip), and a chip scale package (CSP) were also placed on the elastomeric coating, with the irregular surface (bumps) toward the coating and were also held in place on contact, though not as firmly.

The polysiloxane layer, and all the devices placed on it, were covered with a polyethylene film, 0.001 inch thick, which adhered to the elastomeric coating on contact therewith, and prevented movement of the devices. In this manner, all of the devices were held in place and immobilized, even when the tape was taken up on a reel and transported.

The devices were then removed from the tape by peeling the polyethylene film from the elastomer coating, and forming a radius under the polyester film so that the device readily self-peeled from the tape while being captured by a vacuum pick-up tool.

After the devices had been removed, the tape support could be reused.

I claim:

1. An assembly of electronic or electrical devices which comprises
   (1) a flexible support film which (a) is composed of a polymeric material and (b) comprises (i) two longitudinally extending edge portions, and (ii) a substantially flat, longitudinally extending central portion between the edge portions;
   (2) supported by the support film, a fastening layer which is composed of a polymeric material;
   (3) a deformable cover film which (a) is composed of a polymeric material, and (b) is separably attached to the fastening layer; and
   (4) a plurality of electronic or electrical devices which are positioned at spaced-apart locations between the cover film and the central portion of the support film, the cover film being deformed around the devices.

2. An assembly according to claim 1 wherein the fastening layer overlies the central portion of the support film and is contacted by the devices.

3. An assembly according to claim 2 wherein the fastening layer is composed of a soft elastomer.

4. An assembly according to claim 3 having at least one of the following characteristics
   (a) the support film is 0.001 to 0.020 inch thick;
   (b) the elastomer layer is 0.0005 to 0.025 inch thick;
   (c) the elastomer layer has a hardness between 20 on the Shore 00 scale and 70 on the Shore A scale; and
   (d) the cover film is 0.0005 to 0.020 inch thick.

5. An assembly according to claim 4 having each of characteristics (a), (b), (c) and (d).

6. An assembly according to claim 5 wherein the elastomer layer is 0.001 to 0.008 inch thick and has a hardness between 15 on the Shore A scale and 50 on the Shore A scale.

7. An assembly according to claim 6 wherein the elastomer layer is 0.002 to 0.006 inch thick.

8. An assembly according to claim 4 which also includes a sub-film between the support film and the elastomer layer.

9. An assembly according to claim 4 wherein the support film is composed of a polyester, the elastomer is a polysiloxane, and the cover film is comprised of polyethylene.

10. An assembly according to claim 4 which also includes a metal-containing layer which is positioned between the support film and the elastomer layer and which provides ESD protection.

11. An assembly according to claim 1 wherein the fastening layer is not contacted by the devices.

12. A method of making an assembly according to claim 1 which comprises
   (A) providing a support member which comprises
      (1) a flexible support film which (a) is composed of a polymeric material, and (b) comprises (i) two longitudinally extending edge portions, and (ii) a substantially flat, longitudinally extending central portion between the edge portions, and
      (2) supported by the support film, a fastening layer which is composed of a polymeric material;
   (B) placing a plurality of electronic or electrical devices on the support member at spaced-apart locations which overlie the central portion of the support film, while the support member is in a generally horizontal position; and
   (C) applying a deformable cover film to the support member having the devices thereon to form a physically stable and environmentally protected enclosure around the devices.

13. A method according to claim 12 wherein the fastening layer is composed of a soft elastomer and overlies the central portion of the support film, and the devices are placed in contact with the elastomer layer.

14. A method according to claim 13 wherein
   (a) the support film is 0.001 to 0.020 inch thick;
   (b) the elastomer layer is 0.0005 to 0.025 inch thick;
   (c) the elastomer layer has a hardness between 20 on the Shore 00 scale and 70 on the Shore A scale; and
   (d) the cover film is 0.0005 to 0.020 inch thick.

15. A method according to claim 13 wherein the elastomer layer is 0.001 to 0.006 inch thick and is composed of a polysiloxane.

16. A method of processing electronic or electrical devices which comprises
   (A) providing an assembly of electronic or electrical devices which comprises
      (1) a flexible support film which (a) is composed of a polymeric material, and (b) comprises (i) two longitudinally extending edge portions, and (ii) a substantially flat, longitudinally extending central portion between the edge portions;
(2) supported by the support film, a fastening layer which is composed of a polymeric material;
(3) a deformable cover film which (a) is composed of a polymeric material, and (b) is separably attached to the fastening layer; and
(4) a plurality of electronic or electrical devices which are positioned at spaced-apart locations between the cover film and the central portion of the support film, the cover film being deformed around the devices;

(B) advancing said assembly through a work station which separates the cover film from the fastening layer, thus sequentially exposing the devices; and (C) sequentially removing the exposed devices from the support film.

17. A method according to claim 16 wherein step (C) comprising placing the support film having the exposed devices thereon in conforming contact with a convex surface, and removing the exposed device from the support film while the support film conforms to the convex surface.

18. A support member for use in tape carriers for electronic and electrical devices, the member comprising (1) a flexible support film which (a) is composed of a polymeric material, (b) is 0.25 to 2.00 inch wide and (c) comprises (i) two longitudinally extending edge portions, at least one of the edge portions having sprocket holes at longitudinally spaced regular intervals, and (ii) a substantially flat longitudinally extending central portion between the edge portions; and (2) supported on the central portion of the support film, a fastening layer.

19. A support member according to claim 18 wherein the fastening layer is composed of an elastomer having a hardness between 20 on the Shore 00 scale and 70 on the Shore A scale.

20. A support member according to claim 18 which comprises a metallic layer on the surface of the support film.

* * * * *